United States Patent
Shapson

(10) Patent No.: US 7,577,983 B2
(45) Date of Patent: Aug. 18, 2009

(54) CABLE TELEVISION REVERSE AMPLIFIER

(75) Inventor: Jay F. Shapson, Englishtown, NJ (US)

(73) Assignee: Extreme Broadband Engineering, LLC, Englishtown, NJ (US)

(*) Notice: Subject to any disclaimer, the term of this patent is extended or adjusted under 35 U.S.C. 154(b) by 941 days.

(21) Appl. No.: 11/037,917

(22) Filed: Jan. 18, 2005

(65) Prior Publication Data

US 2006/0041922 A1    Feb. 23, 2006

Related U.S. Application Data

(60) Provisional application No. 60/603,145, filed on Aug. 20, 2004.

(51) Int. Cl.
H04N 7/16 (2006.01)
H04N 7/173 (2006.01)
H01P 5/12 (2006.01)
H01R 9/05 (2006.01)

(52) U.S. Cl. .............. 725/149; 725/127; 725/130; 333/100; 439/581

(58) Field of Classification Search .............. 725/119, 725/121, 124, 125, 127, 128, 130; 330/123, 330/127, 199, 200, 297; 348/707, 730; 439/63, 439/578, 581, 638, 639, 654
See application file for complete search history.

(56) References Cited

U.S. PATENT DOCUMENTS

| | | | | | |
|---|---|---|---|---|---|
| 3,668,307 | A | * | 6/1972 | Face et al. | 725/119 |
| 4,560,946 | A | * | 12/1985 | Yokoyama | 330/149 |
| 4,648,682 | A | * | 3/1987 | Tubbs | 439/391 |
| 4,990,109 | A | * | 2/1991 | Romerein et al. | 439/801 |
| 5,109,286 | A | | 4/1992 | West, Jr. et al. | 358/349 |
| 5,394,559 | A | | 2/1995 | Hemmie et al. | 455/5.1 |
| 5,781,844 | A | | 7/1998 | Spriester et al. | 455/3.3 |
| 5,826,167 | A | | 10/1998 | Jelinek et al. | 455/5.1 |
| 6,047,159 | A | | 4/2000 | Powell et al. | 455/3.1 |
| 6,054,905 | A | * | 4/2000 | Gresko | 333/100 |
| 2003/0192063 | A1 | * | 10/2003 | Runkle | 725/149 |

\* cited by examiner

*Primary Examiner*—Dominic D Saltarelli
*Assistant Examiner*—Nicholas T Corbo
(74) *Attorney, Agent, or Firm*—Watov & Kipnes, P.C.; Kenneth Watov

(57) ABSTRACT

A signal input port of a reverse amplifier is provided by an FIC connector, for direct connection to an F-port output of a forward amplifier, thereby eliminating the need for jumper cables. Also, via this connection, the reverse amplifier remotely provides power to the forward amplifier.

3 Claims, 2 Drawing Sheets

CABLE TELEVISION REVERSE AMPLIFIER

RELATED APPLICATION

The present invention is related to and takes priority from U.S. Utility Patent Application Ser. No. 60/603,145, filed on Aug. 20, 2004, for "CABLE TELEVISION REVERSE AMPLIFIER."

FIELD OF THE INVENTION

The present invention relates generally to amplifiers, and more specifically to cable television reverse amplifiers.

BACKGROUND OF THE INVENTION

It is known in the cable television art to provide a forward amplifier for typically amplifying signals from 52 MHz to 1.0 GHz and passing lower frequency signals without amplification. Forward amplifiers are used to overcome splitter loss, for example, typically in a user's home, in order to amplify the television signals supplied to the user's television set. A cable television reverse amplifier is typically used to amplify signals between 5 MHz to 42 MHz, which represent lower band frequency signals mainly for the transmission of data. A problem exists with these prior art amplifiers, in applications where one desires to connect a reverse amplifier to the output of a forward amplifier for providing for amplification of the lower band signals along with passing the amplified higher band signals from the forward amplifier. Presently, installers or homeowners must use a jumper cable between the output connector of a forward amplifier and input connector of a reverse amplifier, when connecting the two together. To save installation time, increase reliability, and decrease space requirements, there is a need in the art to eliminate the use of jumper cables, as indicated above. Also, there is a need in the art for providing power from the reverse amplifier to the forward amplifier.

SUMMARY OF THE INVENTION

The present invention in one embodiment provides means for directly connecting the output connector of a forward amplifier directly to the input connector of a reverse amplifier, and in another embodiment provides means for remotely applying power to the reverse amplifier, and to the forward amplifier via its connection to the reverse amplifier.

BRIEF DESCRIPTION OF THE DRAWING

Various embodiments of the invention are described in detail below with reference to the drawing, wherein.

DETAILED DESCRIPTION OF THE INVENTION

Figure 1:
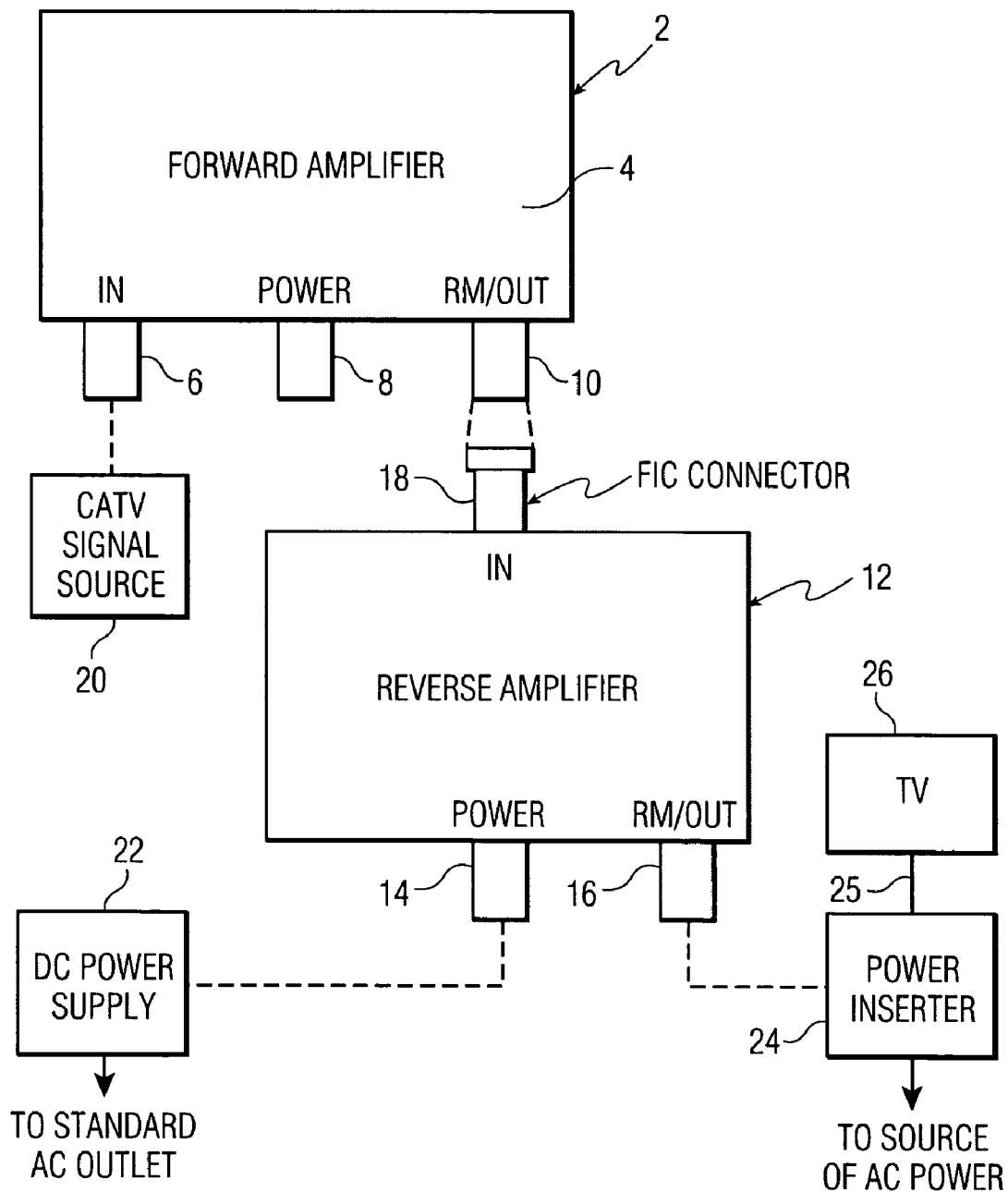
FIG. 1 shows a block schematic assembly drawing for one embodiment of the invention.

With reference to FIG. 1, a forward amplifier 2 includes protruding from a housing 4, a 75 ohm female signal input connector 6, a 75 ohm female power input connector 8, and a 75 ohm signal output connector 10, in this example. Typically connectors 6, 8, and 10 are provided by 75 ohm female F-port connectors, in this example. In one embodiment of the invention, a reverse amplifier 12 includes 75 ohm female power and signal output F-port connectors 14, 16, respectively, in this example, and an FIC port connector 18 at a signal input. The FIC port connector 18 of the reverse amplifier 12 can be directly connected to the female F-port output connector 10 of forward amplifier 2, thereby eliminating the need for using a jumper cable having an F-type male connector at each end for electrically connecting the aforesaid ports together. For purposes of this invention, an FIC-port connector is defined as a connector configured for direct mounting upon a housing of an electrical or electronic device, with the connector further being configured as a male connector for direct electrical and mechanical securement to a female F-port connector.

In another embodiment of the invention, as shown in FIG. 1, the reverse amplifier 12 includes circuitry shown in FIG. 2 (described in detail below) for permitting the reverse amplifier to be either powered by a DC power supply 22 that is typically connected to a standard AC outlet, when used for example in the home. The DC voltage or power output from DC power supply 22 is connected via a cable to "power" F-port connector 14, of the reverse amplifier 12. The output terminal 16 of the latter is typically connected via a 75 ohm cable to a home television set, such as television set 26. Alternatively, in applications where the forward amplifier 2 and reverse amplifier 12 are used in an attic of a home, or in some other location where a standard AC outlet is not readily available, for example, a long cable run 25 must be used to deliver the television signals to the TV set 26, and a typical power inserter 24 must then be utilized. The power inserter 24 is connected to a source of AC power and has a 75 ohm cable connected to the remote power and output port 16 of reverse amplifier 12. The television signal is connected from F-port 16 of the reverse amplifier 12 to the power inserter 24, and therefrom to the television set 26 via cable 25. Necessary DC voltage or power is provided from the power inserter 24 to the reverse amplifier 12, and from the reverse amplifier 12 via its FIC connector 18 being directly connected to F-port 10 (remote power/signal output) of the forward amplifier 2, thereby also remotely powering the forward amplifier 2. Similarly, when used with the DC power supply 22 connected to the power port 14 of reverse amplifier 12, power is supplied in the aforesaid manner to the forward amplifier 2. In this latter case, the output port 16 is directly connected to the television set 26 via an appropriate 75 ohm cable. In either of the alternative embodiments for providing power to the reverse amplifier 12, and forward amplifier 2, a cable antenna television (CATV) signal source 20 is typically connected to the input port 6 of forward amplifier 2, and the signal output from the forward amplifier 2 is connected via its output port 10 being directly connected to the FIC connector 18 of reverse amplifier 12, as previously described, for providing television signals to the latter. Note also that when used alone, forward amplifier 2 can be powered via its power port 8 being connected to a DC power supply 22, or remotely via a power inserter 24 being connected to the RM/out port 10.

Figure 2:
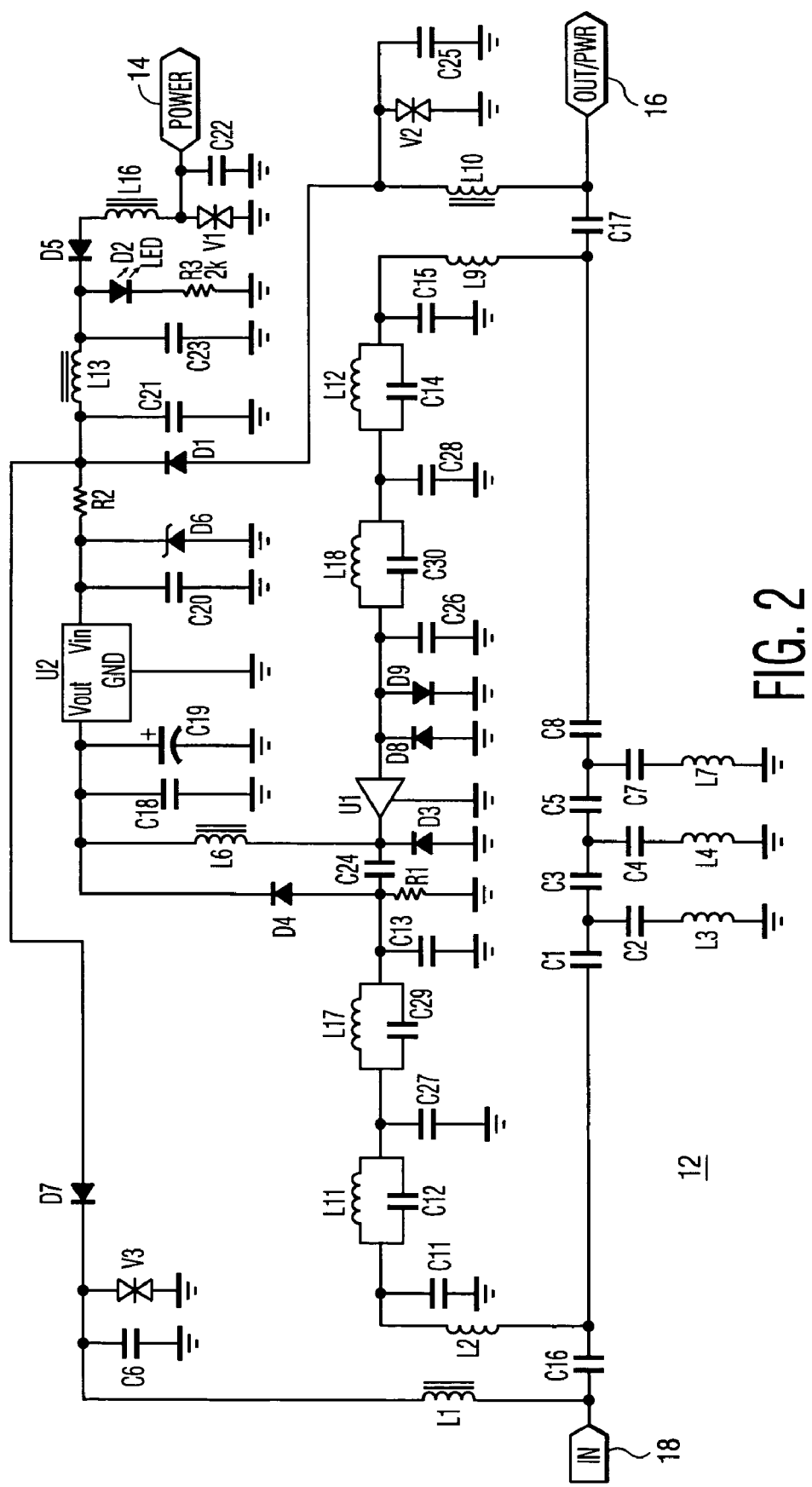
FIG. 2 shows a circuit schematic diagram of a reverse amplifier for an embodiment of the invention.

With reference to FIG. 2, a circuit schematic diagram showing the electrical circuitry for the reverse amplifier 12, for providing various embodiments of the invention will now be described. Note that the circuitry is not meant to be limiting, and that those of skill in the art may recognize other circuitry to provide the same functions. The circuitry of primary interest relative to various embodiments of the invention are concerned with providing DC power to input terminal 18 for providing power to the forward amplifier 2, when the latter's remote power/output terminal 10 is connected to the input terminal 18 of reverse amplifier 12. As previously described, in one embodiment of the invention the reverse amplifier 12 can be provided DC power from a power supply 22 having an output connected to the power terminal 14. The DC power is processed via the circuitry including capacitors C20 through C23, diodes D1 and D5, resistors R2 and R3, chokes or inductors L13 and L16, and zener diode D6. The DC voltage so processed is passed through a voltage regulator U2, with the regulated DC output voltage being applied to capacitors C18 and C19, choke or inductor L6, and diode D4, as shown. In an engineering prototype, voltage regulator U2 was provided by an LM78M06. It is important to note that the DC voltage developed at the common connection of resistor R2, diode D1, capacitor C21, and choke L13, is coupled via diode D7 and choke $L_1$ to input terminal 18, for providing power to the forward amplifier 2 as previously described. Capacitor C6 and bidirectional diode V3 are each connected at one end to the common connection of diode D7 choke L1, and at their other ends to ground. Also, note that a light emitting diode D2 is connected via its anode to the common connection of diode D5, choke L13, and capacitor C23, and at it cathode electrode to one end of a resistor R3, the other end of the latter being connected to ground. When power is applied to either power terminal 14 or remote power/output terminal 16, diode D2 emits light to indicate that the reverse amplifier is turned on.

In another embodiment of the invention, when a power inserter 24 is used as previously described, DC power is connected to remote power/output terminal 16, and processed by components including choke or inductor L10, bidirectional diode V2, capacitor C25, and diode D1. The DC voltage so developed causes diode D2 to emit light. Also, this DC voltage is passed through voltage regulator U2, as previously described. Also, similar to the previously described embodiment, the DC voltage so developed is coupled via diode D7 and choke or inductor L1 to input terminal 18, for providing power to the forward amplifier 2 as previously described.

In either of the two embodiments of the invention described for providing DC power to input terminal 18 for in turn providing power to forward amplifier 2 is blocked by coupling capacitor C16 from other circuitry components providing amplification of the data associated frequencies received at input terminal 18, and for passing higher frequency signals for the television bands to output terminal 16. Another DC blocking capacitor C17 is included at output terminal 16, as shown, for blocking passage of DC voltage therethrough, while passing amplified data frequency band signals, and television band frequency signals received from forward amplifier 2, to output terminal 16. Note that the circuit components including capacitors C1 through C8, and inductors L3, L4, and L7 connected as shown, provide for passing the higher frequency television band signals to capacitor C17 for coupling to output terminal 16, as previously noted. The lower frequency data signals are processed via the components including inductors L2, L11, L17, L18, L12, and L9, and capacitors C11, C12, C27, C29, C13, C24, C26, C30, C28, C14, and C15, resistor R1, diodes D3, D8, and D9, and amplifier U1, interconnected as shown. In an engineering prototype, amplifier U1 was provided by an ADA10,000. As previously indicated, the various embodiments of the present invention are not meant to be limited by the circuitry shown in FIG. 2, in that other circuitry can be developed from providing the same functions.

Although various embodiments of the invention have been shown and described, they are not meant to be limiting. Those of skill in the art may recognize certain modifications to those embodiments, which modifications are meant to be covered by the spirit and scope of the appended claims.

What is claimed is:

1. A combination comprising:
   a cable television reverse amplifier including:
      a first independent housing;
      a signal output port directly mounted upon said housing; and
      at least one signal input port provided by a male FIC connector directly mounted upon said housing;
   a cable television forward amplifier including:
      a second independent housing;
      at least one signal output port provided by a female F type connector for direct mechanical and electrical connection to said male FIC connector of said reverse amplifier, thereby avoiding the use of a coaxial cable connection therebetween;
      means for either directly or remotely providing power to said reverse amplifier; and
      means for transferring power from said reverse amplifier to said forward amplifier via the interconnection therebetween.

2. An apparatus comprising:
   a forward amplifier including:
      a first housing;
      a forward input port directly mounted upon said first housing for receiving a television signal;
      a forward power port directly mounted upon said first housing for directly receiving DC power from a power supply; and
      a combined forward remote power and output port configured as a female F-port connector directly mounted upon said first housing;
   a reverse amplifier including:
      a second housing;
      a reverse input port directly mounted upon said second housing and configured as an FIC connector for providing a cable free direct connection to the F-port connector of the combined remote power and output port of said forward amplifier;
      a reverse power port directly mounted upon said second housing for directly receiving DC power from a power supply;
      a combined reverse remote power and output port directly mounted upon said second housing for receiving DC power from a power inserter rather than from a power supply connected to its power port; and
      means for directing power from the power activated one of said reverse power port or combined reverse remote power and output port to said reverse input port, for supplying power to said forward amplifier via its combined forward remote power and output port.

3. A method for directly connecting in a cable free manner a combined remote power/output port of a forward amplifier to an input port of a reverse amplifier comprising the steps of:
   configuring said remote power/output port of said forward amplifier as a female F-port connector directly mounted on a housing thereof; and
   configuring said input port of said reverse amplifier as a male FIC-port connector directly mounted upon a housing thereof, for permitting said female F-port connector of said forward amplifier to be directly mechanically and electrically secured to said male FIC port connector of said reverse amplifier, thereby avoiding any cable connection therebetween;
   coupling DC power from said reverse amplifier to said forward amplifier via the direct connection of said input port of said reverse amplifier to the combined remote power/output port of said forward amplifier.

* * * * *